United States Patent [19]

Schepens

[11] Patent Number: 5,685,761
[45] Date of Patent: Nov. 11, 1997

[54] MULTI-PURPOSE LAMP FIXTURE TOOL

[76] Inventor: Clyde R. Schepens, 20091 Daugherty Rd., Long Beach, Miss. 39560

[21] Appl. No.: 534,557

[22] Filed: Sep. 27, 1995

[51] Int. Cl.$^6$ ................................................ H01R 3/00
[52] U.S. Cl. ............................. 445/63; 324/133; 7/170
[58] Field of Search ........................... 324/414, 133, 324/556; 7/164, 170; 445/63

[56] References Cited

U.S. PATENT DOCUMENTS

| | | | |
|---|---|---|---|
| 1,319,028 | 10/1919 | Grinnell | 81/3.8 |
| 2,501,548 | 3/1950 | Street | 324/414 |
| 4,027,236 | 5/1977 | Stewart | 324/133 |
| 4,258,313 | 3/1981 | Cheatham, Jr. et al. | 324/133 X |
| 4,414,698 | 11/1983 | Epstein | 7/170 |
| 4,695,803 | 9/1987 | Rue | 324/414 |
| 4,852,925 | 8/1989 | Lodin | 294/2 |
| 5,047,721 | 9/1991 | Farley | 324/414 |
| 5,179,339 | 1/1993 | Volk, Jr. | 324/414 |
| 5,316,512 | 5/1994 | Ell | 445/61 |

*Primary Examiner*—Kenneth J. Ramsey
*Attorney, Agent, or Firm*—Banner & Witcoff, Ltd.

[57] ABSTRACT

A multi-purpose lamp fixture tool for easily testing and repairing common defects of screw-bulb lamp sockets. The tool is configured to check for electrical power input to lamp sockets, repair lamp socket bottom contacts, test light bulbs, and remove the bases of shattered bulbs from lamp sockets. The tool also includes a light bulb indicator which indicates whether electrical power is still being supplied to the lamp socket.

9 Claims, 3 Drawing Sheets

001
MULTI-PURPOSE LAMP FIXTURE TOOL

BACKGROUND OF THE INVENTION

This invention relates to testers and repair devices of lamps, and more particularly to a device that tests lamp sockets and bulbs, repairs lamp sockets, and removes shattered bulbs from lamp sockets.

Electric lamps that use replaceable screw-type light bulbs are common in many places, especially in households. The sockets of these lamps make electrical contact with light bulbs through two contacts: one contact that touches the side of a light bulb's base, and one that touches the bottom. The bottom contact is a tongue-shaped flexible piece that extends upward at an angle of fifteen degrees to the horizontal bottom of the lamp socket. After a lamp has gone through several changings of light bulbs, the bottom contact of the lamp socket can be pushed down and distorted until it can no longer reach a properly installed bulb. When a lamp is defective, many people assume that the problem lies in a mashed-down bottom contact. However, since the problem could lie anywhere in the lamp, people need to determine whether electrical power is still being supplied to the socket before attempting to repair the bottom contact. When the bottom contact obviously cannot reach an installed bulb, most people use their fingers or a tool—such as a pair of pliers—not very appropriate for the job of pulling the contact back up into the correct position. Using fingers or an inappropriate tool in the cramped space could weaken and/or further distort the contact, compounding the problems of the lamp.

A lamp could also fail to light a bulb due to a defective bulb. The most common method of testing a light bulb is to install one into an operable lamp and then turn on the power. If the bulb is defective, a person must turn off the power, unscrew the bulb, and then proceed to test another bulb. This process is time-consuming and inefficient.

These fragile bulbs often shatter, usually due to improper handling or to a lamp falling over. When a bulb shatters while installed in the lamp socket, removing the base of the bulb becomes a difficult task. There are few places left on a shattered bulb safe or secure enough to get a grip. Glass shards and the metal edge of the base easily cut fingers. Pliers are awkward and could further distort the base, rendering the base even more difficult to remove.

SUMMARY OF THE INVENTION

The present invention is a device configured to quickly and easily test for and repair common defects of screw-bulb lamp operation. Specifically, the device is configured to check for electrical power input to lamp sockets, repair lamp socket bottom contacts, test light bulbs, and remove the bases of shattered bulbs from lamp sockets. The device includes metal contacts at one end of a handle that connect via test leads to a light bulb indicator embedded inside the handle. Illumination of the indicator when the contacts are touched to a lamp socket in a defective lamp indicates that electrical power is indeed still being supplied to the socket. Hence, the problem of a defective lamp still receiving power in its lamp socket is probably a distorted bottom contact in the socket. The handle-mounted wedge tool of the device in question fits under the contact and pries it up into its original position when a person raises the device to a vertical position.

When determining whether a light bulb is defective, another portion of the device makes testing a light bulb extremely simple and efficient. Merely touching the base of a light bulb to the contacts on this portion of the device will ignite a LED indicator on the end of the handle if the bulb is operable. If the bulb has a defect, the LED will not light. A battery embedded in the handle powers the LED indicator.

Finally, to remove the stubborn bases of bulbs that shatter while in a lamp socket, the forked, rubber-coated end of the device wedges comfortably into the base to facilitate unscrewing.

Other objects and advantages of the invention will appear in the following description. In the description, references are made to the accompanying drawing which illustrates one embodiment of the invention.

DETAILED DESCRIPTION OF THE PREFERRED EMBODIMENT

Figure 1:
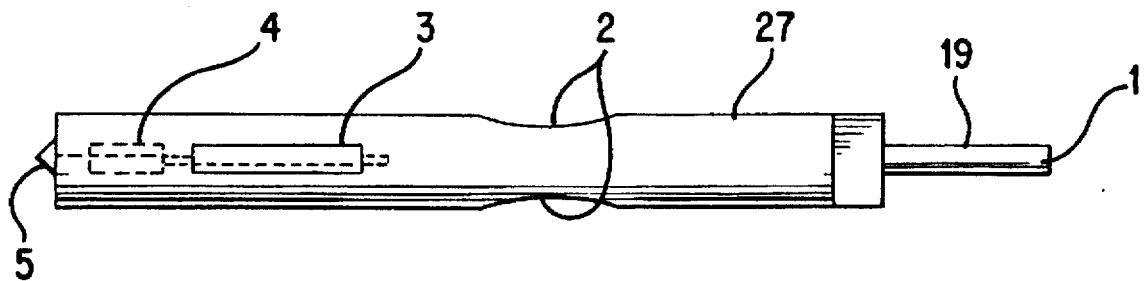
FIG. 1 is a bottom view of the lamp socket tester and repair device of the present invention.
Figure 2:
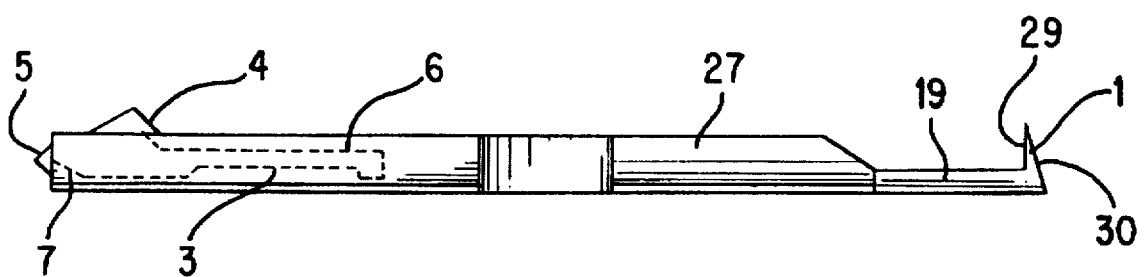
FIG. 2 is a side view of the lamp socket tester and repair device.
Figure 3:
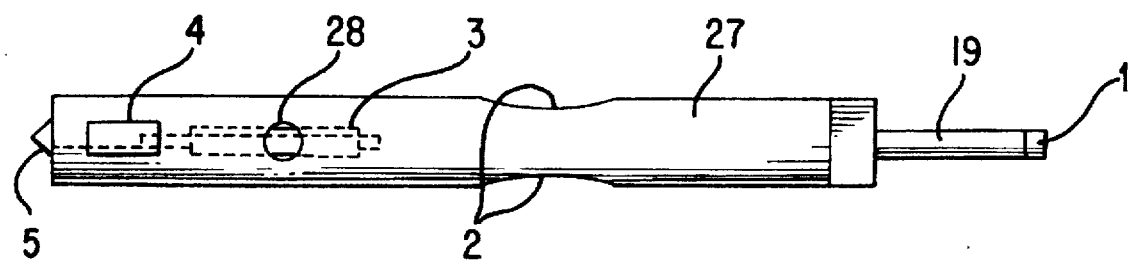
FIG. 3 is a top view of the lamp socket tester and repair device.

Referring to FIG. 1, FIG. 2, and FIG. 3, the lamp socket tester and repair device portion of the invention consists outwardly of a handle 27 with finger grips 2, a shaft 19 for wedge-tool 1, and (on the opposite end of the handle 27 from the wedge-tool 1) highly-conductive metal contacts 5 and 4, respectively. Contact protrudes from the end of the handle 27 in a direction linear to the handle. Contact 4 protrudes from the side of handle 27 at the end of the handle adjacent to contact 5. Inwardly, the tool consists of test leads 7 and 6 (FIG. 2), which are wires that run from contacts 5 and 4, respectively, to indicator lamp or LED 3. A hole approximately 7 mm in diameter in the handle 27 and positioned over the lamp 3 allows the bulb in the lamp to be seen by a person using the tool. The end of the tool having contacts 5 and 4 is configured so that contact 5 will touch the bottom contact 23 (FIG. 8) of a lamp socket 22 (FIG. 8) while contact 4 simultaneously touches the side contact 26 (FIG. 8) of the lamp socket. Touching the contacts of the device and of the lamp socket together creates a circuit that will light the indicator lamp 3 if electrical power is being supplied to lamp socket 22. When a person is able to ascertain with this device that no power is being supplied to a lamp socket, then the person will know not to tamper with—and possibly damage—the bottom contact 23, which often is the defect in a defective lamp.

Figure 8:
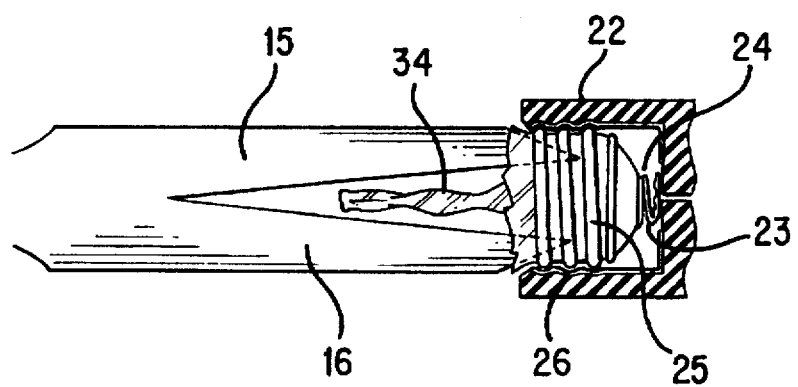
FIG. 8 is a cut-away side view of a screw-bulb type lamp socket, a side view of a light bulb base installed in the socket, and a partial top view of the forked end of the broken bulb remover inserted into the bulb base.

On the opposite end of handle 27 from the contacts, the shaft 19 extends in a direction linear to the handle 27 for approximately 2 in. Wedge-tool 1 is positioned on the end of shaft 19. The bottom 29 of the tapered wedge-tool 1 extends perpendicularly from shaft 19 for approximately 5 mm. The top 30 and bottom 29 of the wedge form a taper of approximately 30 degrees. This taper serves to slide the edge of wedge-tool 1 under a distorted or pushed-down lamp socket bottom contact 23. (FIG. 8) If the wedge-tool 1 is positioned under the bottom contact 23 and the handle 27 is raised to a vertical position, the bottom contact will be restored to its original position where it can reach a properly installed light bulb 25. (FIG. 8)

The handle 27 is generally cylindrically-shaped and is made of injected molded thermoplastic. The shaft 19 and wedge-tool 1 are constructed from a light-weight metal alloy with low conductivity.

Figure 4:
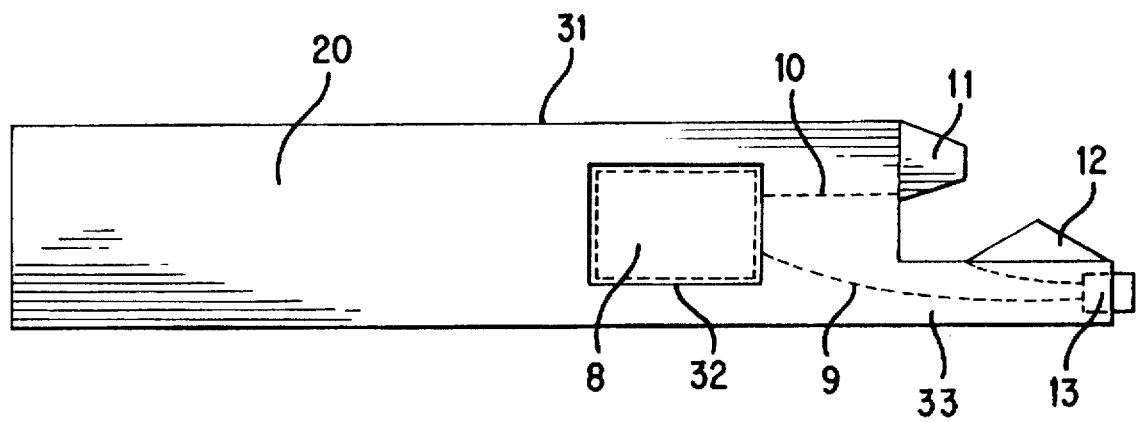
FIG. 4 is side view of the light bulb tester of the present invention.
Figure 5:
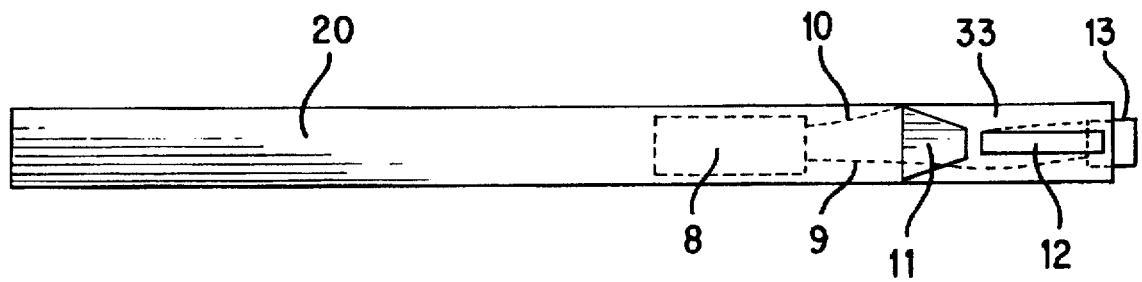
FIG. 5 is a top view of the light bulb tester.

Referring now to FIG. 4 and FIG. 5, the light bulb tester portion of the invention consists outwardly of a rectangular handle 20, a metal contact 11, a metal contact 12, and a LED indicator 13. Contact 11 rests on the end of handle 20 in a direction linear to the handle. Contact 12 rests on top of section 33, which is on the end of the handle 20 and extends approximately 1.5 in. farther than the rest of the handle. The LED indicator 13 extends from the end of section 33 in a direction linear with the handle 20. Inwardly, the device consists of test leads 9 and 10, which are wires that create a partial series circuit between the contact 11, power source 8, LED indicator 13, and contact 12. The power source, which is embedded in the handle, is a replaceable 9 v battery attached to the device by male and female ends on the test leads 9 and 10. The battery is replaceable through removable flush battery cover 32.

The light bulb tester is configured so that contact 12 can touch a light bulb side contact 25 (FIG. 8) while contact 11 simultaneously touches bulb bottom contact 24. Under this condition, an operable light bulb completes the partial circuit of the device and, hence, the LED indicator 13 ignites. On the other hand, if the contacts of a defective bulb touch the contacts of the device, then the LED will not light, indicating a defect in the bulb. The simple method of testing a light bulb by merely touching the light bulb to the convenient contacts on the device makes testing light bulbs a time-efficient process, especially in large quantities.

Figure 6:
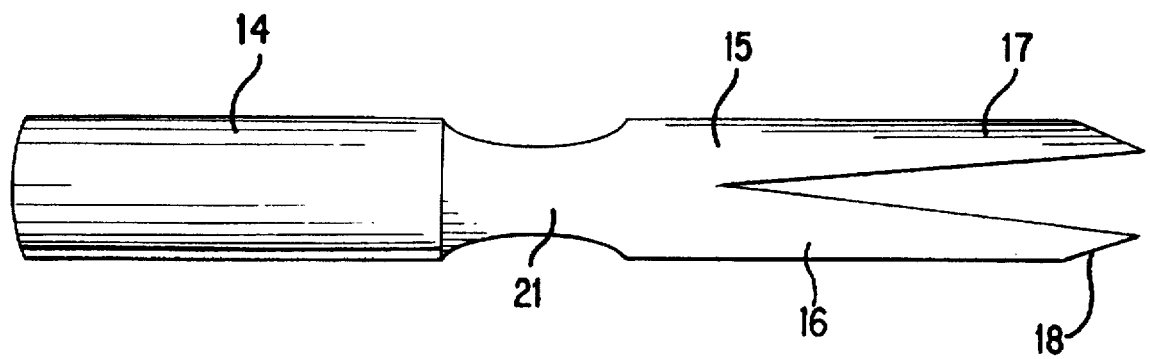
FIG. 6 is a top view of the broken bulb remover of the present invention.
Figure 7:
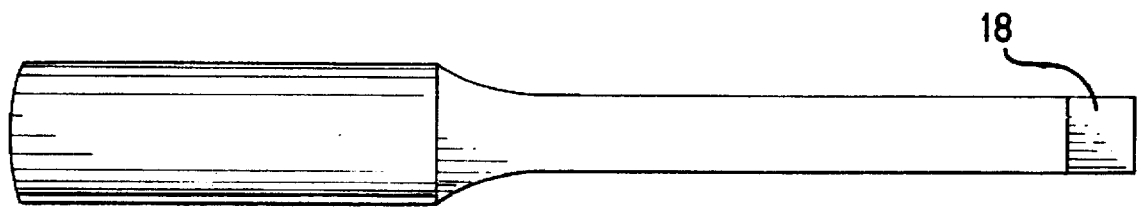
FIG. 7 is a side view of the broken bulb remover.

Referring now to FIG. 6 and FIG. 7, the broken bulb remover comprises a 5 in. handle 14 and a forked end 21, which extends from one end of the handle in a direction linear to the handle. The ends 17 and 18 of the fork 21 are tapered so that they can wedge snugly into any shattered bulb's base 25, as illustrated in FIG. 8. The prongs 15 and 16 of the fork have sufficient space between them to be able to accommodate the base portion 34 extending up from the bulb base 25. In order to remove a bulb base 25 (FIG. 8) from a lamp socket 22 (FIG. 8), a person would wedge the prongs 15 and 16 of the device into the bulb base, as illustrated in FIG. 8, and then unscrew the base as one would normally remove a bulb.

The handle 14 of the device is preferably made of wood or thermoplastic. The forked end 21 of the device is made of a lightweight, non-conductive metal alloy and is coated with rubber for better grip.

It should be obvious from the above-discussed apparatus embodiment that numerous other variations and modifications of the apparatus of this invention are possible, and such will readily occur to those skilled in the art. Accordingly, the scope of this invention is not to be limited to the embodiment disclosed, but is to include any such embodiments as may be encompassed within the scope of the claims appended hereto.

What is claimed is:

1. For testing electrical power input into a standard household screw-type lamp socket, which has a side contact and a flexible bottom contact, and for repairing said bottom contact, a device including:

a handle;

a shaft extending from said handle;

a wedge-tool on the end of said shaft;

two electrical contacts; and an indicator lamp.

2. The tool of claim 1 wherein said wedge-tool is perpendicular to said shaft.

3. The tool of claim 2 wherein said wedge-tool is tapered at such an angle that when positioned under said bottom lamp socket contact, the bottom contact is restored to an operable position when said handle is raised to a vertical position.

4. The tool of claim 1 wherein said electrical contacts are positioned for simultaneous ability to touch corresponding contacts in said lamp socket.

5. A repair device for use with an electrical lamp socket having a side contact and a bottom contact, said repair device comprising:

a handle;

a shaft extending from said handle;

a wedge-tool on the end of said shaft;

two electrical contacts; and an indicator lamp.

6. The repair device of claim 5 wherein said wedge-tool is perpendicular to said shaft.

7. The repair device of claim 6 wherein said wedge-tool is tapered at such an angle that when positioned under said bottom lamp socket contact, said bottom contact is restored to an operable position when said handle is raised to a vertical position.

8. The repair device of claim 7 wherein said electrical contacts are positioned for simultaneous ability to touch corresponding contacts in said lamp socket.

9. The repair device of claim 8, wherein said device further includes a visual display, said visual display being activated when said electrical contacts touch said corresponding contacts in said lamp socket when electrical power is being received by said corresponding contacts.

* * * * *